US006300207B1

(12) United States Patent
Ju

(10) Patent No.: US 6,300,207 B1
(45) Date of Patent: Oct. 9, 2001

(54) DEPLETED SIDEWALL-POLY LDD TRANSISTOR

(75) Inventor: Dong-Hyuk Ju, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/583,105

(22) Filed: Mar. 26, 1998

Related U.S. Application Data

(62) Division of application No. 08/753,616, filed on Nov. 27, 1996, now Pat. No. 5,804,856.

(51) Int. Cl.[7] ..... H01L 21/336

(52) U.S. Cl. ..... 438/305; 438/299; 438/303; 438/304; 438/596; 438/976

(58) Field of Search ..... 438/159, 163, 438/180, 184, 267, 277, 290, 299, 301, 303, 304, 305, 306, 307, 595, 596, 976

(56) References Cited

U.S. PATENT DOCUMENTS 5,418,392 * 5/1995 Tanabe ..... 257/336
5,770,506 * 6/1998 Koh ..... 438/303
6,004,852 * 12/1999 Yeh et al. ..... 438/303
6,184,097 * 2/2001 Yu ..... 438/299

* cited by examiner

*Primary Examiner*—Charles Bowers
*Assistant Examiner*—Jack Chen
(74) *Attorney, Agent, or Firm*—Sawyer Law Group LLP

(57) ABSTRACT

The present invention is directed to a metal oxide semiconductor transistor having a fully overlapped lightly doped drain (LDD) structure which offers the advantages of conventional fully overlapped LDD transistors but which significantly reduces the drain-to-gate overlap capacitance associate therewith. To achieve fully overlapped LDD construction and reduced drain-to-gate overlap capacitance, the metal oxide semiconductor transistor of the present invention employs a gate electrode comprising a main gate region formed from heavily doped polysilicon and depleted sidewall polysilicon spacers formed from undoped or depleted polysilicon. In the MOS transistor of the present invention, the lightly doped regions are fully over-lapped by the combination of the depleted sidewall polysilicon spacers and the main gate region.

12 Claims, 2 Drawing Sheets

26
28
28
18
12a
14a
12b
14b
10

32
26
32
34
34
12a
14a
36
36
12b
14b
12
14
16
10

DEPLETED SIDEWALL-POLY LDD TRANSISTOR

This application is a division of Ser. No. 08/753,616 filed Nov. 27, 1996 U.S. Pat. No. 5,804,856.

TECHNICAL FIELD

The present invention relates to metal oxide semiconductor field-effect transistors (MOSFETs), and, more particularly, to lightly doped drain (LDD) structures. Specifically, the present invention relates to an improved MOSFET structure employing LDD technology which significantly reduces drain-to-gate overlap capacitance.

BACKGROUND ART

Attempts continue to shrink the dimensions for fabricating metal oxide semiconductor (MOS) transistors. Devices having sub-micrometer dimensions permit closer placement of devices, thereby increasing the density of devices on a chip and also increasing device operating speed.

A conventional MOS transistor which is formed in a semiconductor substrate includes a drain region and a source region separated by a channel region. The channel region resides beneath a gate comprising a gate oxide and a gate electrode formed thereon. A conducting channel is induced in the channel region by an electric field established between the gate and the semiconductor substrate.

To fabricate an MOS transistor, the drain region and the source region are formed in the semiconductor substrate, which has a first conductivity (e.g., p-type), by doping selected regions of the semiconductor substrate. Doping is performed such that the drain region and the source region have a second conductivity (e.g., n-type) that is opposite to the first conductivity. In the case where the semiconductor substrate comprises silicon, the gate electrode and the gate oxide may comprise, for example, polysilicon ("poly") and silicon dioxide, respectively.

Hot-carrier degradation is a major limitation of scaling down the dimensions of MOS devices; hot-carrier degradation results from the high electric fields encountered in submicrometer MOSFETs. Although an energy barrier separates the gate oxide from the semiconductor substrate, electrons (known as"hot carriers") that have enough energy to overcome this energy barrier are injected into the gate oxide. The injection of these"hot carriers" causes damage to the gate oxide, which affects the performance of the MOS device. Hot-carrier degradation refers to the performance degradation that results from this damage to the gate oxide.

Hot-carrier degradation is reduced by the structure of lightly doped drain (LDD) transistors. The key feature of LDD technology is the insertion of a graded, or more gently profiled, lightly doped drain region, such as an $n^-$drain region, between the channel region and a heavily doped part of the drain region, such as an $n^{30}$ drain region. As is conventional, the term"drain" may be used generically and can apply to both the drain and the source. Accordingly, in LDD transistors, a graded, or more gently profiled, lightly doped source region, such as an $n^{31}$ source region, is inserted between the channel region and a heavily doped part of the source region, such as an $n^{30}$source region. The source-side LDD is formed simultaneously with the drain-side LDD. A voltage is sustained mainly across the drain-side LDD. The lightly doped drain region sustains the drain voltage over a longer area. Similarly, the lightly doped source region sustains a source voltage over a longer area. Thus, the peak electric field at the drain region and source region is reduced.

There are many types of LDD transistors presently in use which reduce the hot-carrier degradation inherent in MOSFETs. For example, performance degradation due to hot carrier damage in MOS transistors can be improved by making LDD regions (i.e., the lightly doped drain region and the lightly doped source region) fully overlapped by the gate electrode. Such an approach is demonstrated by gate overlapped drain (GOLD) structures as well as inverse-T gate LDD (ITLDD) structures. These conventional fully overlapped LDD structures, however, suffer from a high capacitance between the gate and drain region as well as between the gate and source region. Such capacitance is conventionally known in the art as drain-to-gate overlap capacitance. In conventional fully overlapped LDD structures, the drain-to-gate overlap capacitance typically corresponds to the value of capacitance across the gate oxide. This value of capacitance depends on the thickness of the gate oxide. Disadvantageously, a high drain-to-gate overlap capacitance can seriously limit AC circuit performance.

Thus, what is needed is an improved MOSFET structure that employs LDD regions that are fully overlapped by gate polysilicon but that has a drain-to-gate overlap capacitance significantly reduced in comparison to conventional fully overlapped LDD transistors.

DISCLOSURE OF INVENTION

In accordance with the invention, a metal oxide semiconductor transistor formed in a semiconductor substrate having a first conductivity is provided. The metal oxide semiconductor transistor comprises:

(a) a heavily doped source region, a lightly doped source region, a heavily doped drain region, and a lightly doped drain region, each having a second conductivity opposite the first conductivity;

(b) a channel region in the semiconductor substrate having the first conductivity and separating the heavily doped source region and the heavily doped drain region, the lightly doped source region located adjacent the heavily doped source region and extending to the channel region, the lightly doped drain region located adjacent the heavily doped drain region and extending to the channel region;

(c) a gate oxide covering at least the channel region, the lightly doped source region, and the lightly doped drain region; and (d) a gate electrode formed on the gate oxide comprising (i) a main gate region formed over the channel region comprising doped polysilicon and having two sidewalls and (ii) a depleted sidewall polysilicon spacer comprising depleted polysilicon formed adjacent each of the two sidewalls and at least partially overlapping the lightly doped source region and the lightly doped drain region, the combination of the depleted sidewall polysilicon spacers and the main gate region fully overlapping the lightly doped source region and the lightly doped drain region.

The method for constructing the metal oxide semiconductor transistor of the present invention comprises the following steps:

(a) forming a gate oxide on the semiconductor substrate covering at least the channel region, the lightly doped drain region, and the lightly doped source region;

(b) depositing and patterning a layer of polysilicon on the gate oxide thereby forming a main gate region over the channel region having two sidewalls;

(c) forming a mask on the semiconductor substrate which includes two disposable spacers each of which is adjacent one of the sidewalls;

(d) exposing the main gate region and portions of the semiconductor substrate to a first ion implant and subsequent anneal, thereby doping the main gate region and forming the heavily doped source region and the heavily doped drain region;

(e) removing the disposable spacers;

(f) exposing the semiconductor substrate to a second ion implant and subsequent anneal, thereby forming the lightly doped source region and the lightly doped drain region below where the disposable spacers were previous located; and (g) providing a depleted sidewall polysilicon spacer comprising depleted polysilicon adjacent each of the two sidewalls by depositing and patterning undoped polysilicon such that the lightly doped source region and the lightly doped drain region are completely fully overlapped by the combination of the depleted sidewall polysilicon spacers and the main gate region, the undoped polysilicon covering a portion of the lightly doped source region and a portion of the lightly doped drain region.

The depleted sidewall polysilicon spacers which overlap the lightly doped regions, i.e., the lightly doped source region and the lightly doped drain region, provide the advantages of conventional fully overlapped LDD transistors. In particular, performance degradation due to damage induced by hot carrier injection into the gate oxide is improved because the lightly doped regions lie beneath the gate polysilicon. However, since the gate polysilicon which overlaps the lightly doped regions comprises depleted polysilicon, the drain-to-gate overlap capacitance is reduced in comparison with conventionally employed fully overlapped LDD transistors wherein the gate polysilicon that overlaps the LDD regions does not comprise depleted polysilicon.

Other objects, features, and advantages of the present invention will become apparent upon consideration of the following detailed description and accompanying drawings, in which like reference designations represent like features throughout the Figures.

BRIEF DESCRIPTION OF THE DRAWINGS

The drawings referred to in this description should be understood as not being drawn to scale except if specifically noted. Moreover, the drawings are intended to illustrate only one portion of an integrated circuit fabricated in accordance with the present invention.

FIGS. *2a–2d* are cross-sectional views depicting the process flow of the present invention and the resulting structure.

BEST MODES FOR CARRYING OUT THE INVENTION

Reference is now made in detail to a specific embodiment of the present invention, which illustrates the best mode presently contemplated by the inventor for practicing the invention. Alternative embodiments are also briefly described as applicable.

The present invention is directed to a metal oxide semiconductor transistor having a fully overlapped lightly doped drain (LDD) structure, which offers the advantages of conventional fully overlapped LDD transistors, but, which significantly reduces the drain-to-gate overlap capacitance associated therewith.

To achieve fully overlapped LDD construction and reduced drain-to-gate overlap capacitance, the metal oxide semiconductor transistor of the present invention employs a gate electrode comprising a main gate region formed from heavily doped polysilicon and depleted sidewall polysilicon spacers formed from undoped polysilicon. In the MOS transistor of the present invention, the lightly doped regions are fully overlapped by the depleted sidewall polysilicon spacers and the main gate region.

In particular, the metal oxide semiconductor transistor, which is formed in a semiconductor substrate having a first conductivity, comprises:

(a) a heavily doped source region, a lightly doped source region, a heavily doped drain region, and a lightly doped drain region, each having a second conductivity opposite the first conductivity;

(b) a channel region in the semiconductor substrate having the first conductivity and separating the heavily doped source region and the heavily doped drain region, the lightly doped source region located adjacent the heavily doped source region and extending to the channel region, the lightly doped drain region located adjacent the heavily doped drain region and extending to the channel region;

(c) a gate oxide covering at least the channel region, the lightly doped source region, and the lightly doped drain region; and (d) a gate electrode formed on the gate oxide comprising (i) a main gate region formed over the channel region comprising doped polysilicon and having two sidewalls and (ii) a depleted sidewall polysilicon spacer comprising depleted polysilicon formed adjacent each of the two sidewalls and at least partially covering the lightly doped source region and the lightly doped drain region, the combination of the depleted sidewall polysilicon spacers and the main gate region fully covering the lightly doped source region and the lightly doped drain region.

Figure 1:
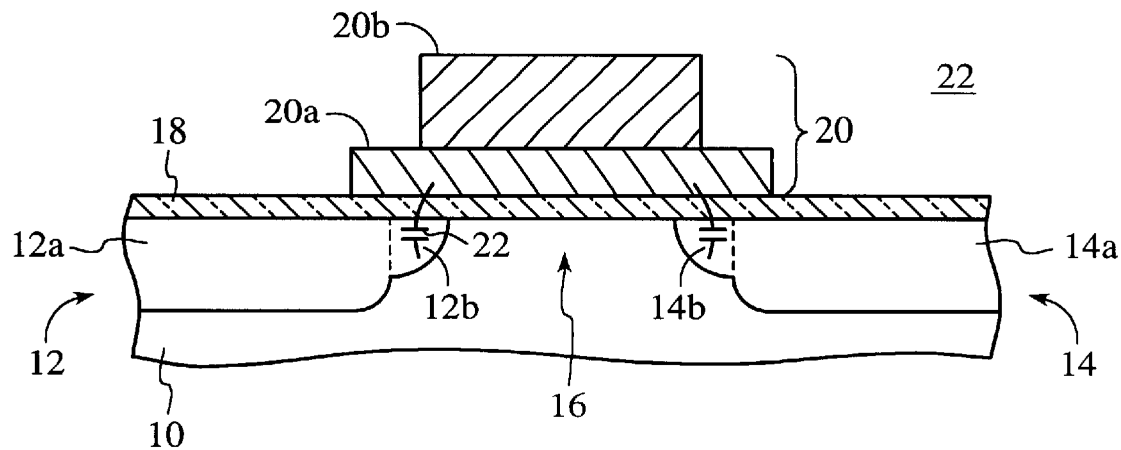
FIG. 1 is a cross-sectional view of an inverse-T gate, lightly doped drain (ITLDD) structure shown in prior art.

Referring now to FIG. 1, wherein like reference numerals designate like elements throughout, an inverse-T gate, lightly doped drain (ITLDD) structure is presented as an example of an LDD transistor shown in the prior art that is designed to reduce hot-carrier degradation.

In particular, FIG. 1 depicts a semiconductor substrate 10 comprising, for example, silicon which is doped p-type. A source region 12 and a drain region 14 are formed in the semiconductor substrate 10 by doping the silicon n-type in those regions. As shown in FIG. 1, the source region 12 and the drain region 14 are separated by a channel region 16.

The source region 12 comprises a heavily doped source region (or $n^+$ source region) 12*a* and a lightly doped source region (or $n^-$ source region) 12*b*. The lightly doped source region 12*b* resides adjacent the heavily doped source region 12*a* and extends to the channel region 16. Similarly, the drain region 14 comprises a heavily doped drain region (or $n^+$ drain region) 14*a* and a lightly doped drain region (or $n^+$ drain region) 14*b*. The lightly doped drain region 14*b* resides adjacent the heavily doped drain region 14*a* and extends to the channel region 16.

A gate oxide 18 covers the channel region 16 and portions of the source region 12 and drain region 14 which are shown in FIG. 1. A gate electrode 20 comprising polysilicon, i.e., gate polysilicon, is formed on the gate oxide 18. The gate electrode 20 includes a first thin layer of polysilicon 20*a* and a second thicker layer of polysilicon 20*b* formed thereon. The first thin layer of polysilicon 20*a* is wider than the second thicker layer of polysilicon 20*b*. Accordingly, the gate electrode 20 resembles an inverted"T".

The gate electrode 20 is formed over the channel region 16 and overlaps part of the source region 12 and the drain region 14. In particular, the first thin layer of polysilicon 20*a* completely overlaps the lightly doped source region 12*b* as well as the lightly doped drain region 14*b* and part of the heavily doped source region 12*a* as well as part of the heavily doped drain region 14*a*. The second thicker layer of polysilicon 20*b* only partially overlaps the lightly doped source region 12*b* and the lightly doped drain region 14*b*.

To reduce hot-carrier degradation, the goal is to locate the LDD regions, i.e., the lightly doped source region 12*b* and the lightly doped drain region 14*b*, underneath the gate electrode 20. The hot carriers involved in hot carrier injection in LDD transistors typically originate in the $n^-$ drain region 14*b*; that is, the $n^-$ drain region is responsible for hot carrier degradation. Thus, with the inverse-T gate configuration shown in FIG. 1, the location of hot carrier injection is beneath the gate polysilicon. Accordingly, performance degradation due to hot carrier injection is reduced. As described above, performance degradation due to hot carrier damage can be improved by making the LDD regions fully overlapped by the gate polysilicon.

However, with LDD regions fully overlapped by the gate polysilicon, a capacitance exists between the gate electrode 20 and source region 12 as well as between the gate electrode and the drain region 14. (The drain-to-gate overlap capacitance affects AC performance much more than source-to-gate capacitance, therefore, drain-to-gate capacitance is a main concern.) FIG. 1 shows capacitors 22 which represent the drain-to-gate overlap capacitance. As described above, the drain-to-gate overlap capacitance typically corresponds to the value of capacitance across the gate oxide 18, $C_{oxide}$. This value of capacitance is determined by the thickness of the gate oxide 18. Disadvantageuosly, conventional fully overlapped LDD transistors suffer from high drain-to-gate overlap capacitance which limits AC circuit performance.

In accordance with the present invention, however, a metal oxide semiconductor transistor is provided which employs LDD regions that are fully overlapped by the gate polysilicon but which has a drain-to-gate overlap capacitance which is significantly reduced in comparison to conventional fully overlapped LDD transistors.

To achieve fully overlapped LDD construction and reduced drain-to-gate overlap capacitance, the metal oxide semiconductor transistor of the present invention employs a gate electrode 20 comprising a main gate region formed from heavily doped polysilicon and depleted sidewall polysilicon spacers formed from undoped polysilicon. In the MOS transistor of the present invention, the lightly doped regions, or LDD regions, are fully overlapped by the depleted sidewall polysilicon spacers and the main gate polysilicon.

The process flow for fabricating the metal oxide semiconductor transistor of the present invention is depicted in FIGS. 2*a*–2*d*. In particular, a process flow is provided which is applicable to fabricating an MOS transistor in a semiconductor substrate 10 comprising silicon which is doped p-type. It will be appreciated, however, that the process of the present invention is not limited to semiconductor substrates 10 which are doped p-type. In particular, a semiconductor substrate 10 that is doped n-type may be used in the formation of the MOS transistor of the present invention.

Figure 2A:
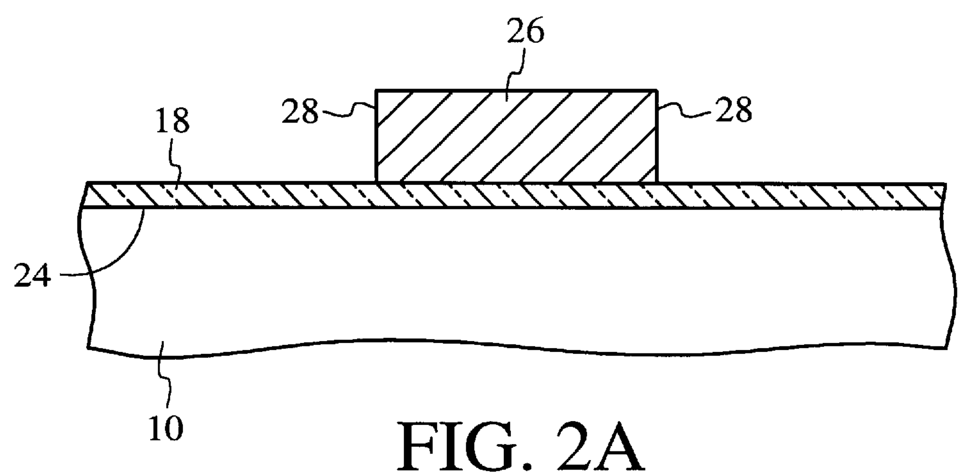

Refer now to FIG. 2*a*, wherein a semiconductor substrate 10 which is doped p-type is depicted having a surface 24 upon which a gate oxide 18 is formed. As is conventional, a thermal oxidation process is employed to convert at least a portion of the surface 24 of the semiconductor substrate 10 to oxide. Specifically, the semiconductor substrate 10 is annealed, e.g., at about 900° C., in an oxygen-containing atmosphere. The oxygen-containing atmosphere contains an oxygen-containing species that reacts with the surface 24 of the semiconductor substrate 10 to form oxide under the conditions provided by the anneal.

A patterned layer of polysilicon 26 is then formed on the gate oxide 18. This patterned layer of polysilicon 26 will serve as the main gate region of a gate electrode 20 for the metal oxide semiconductor transistor of the present invention. The layer of polysilicon or the main gate region 26 has two sidewalls 28 as depicted in a the cross sectional view shown in FIG. 2*a*.

It will be appreciated that conventional processing is employed up to the definition of the gate polysilicon which forms the main gate region 26. It will further be appreciated that while one such main gate region 26 is shown, it will be readily apparent to those skilled in this art that in fact a plurality of such main gate regions are formed in the case where a plurality of metal oxide semiconductor transistors are to be created on the semiconductor substrate 10.

Figure 2B:
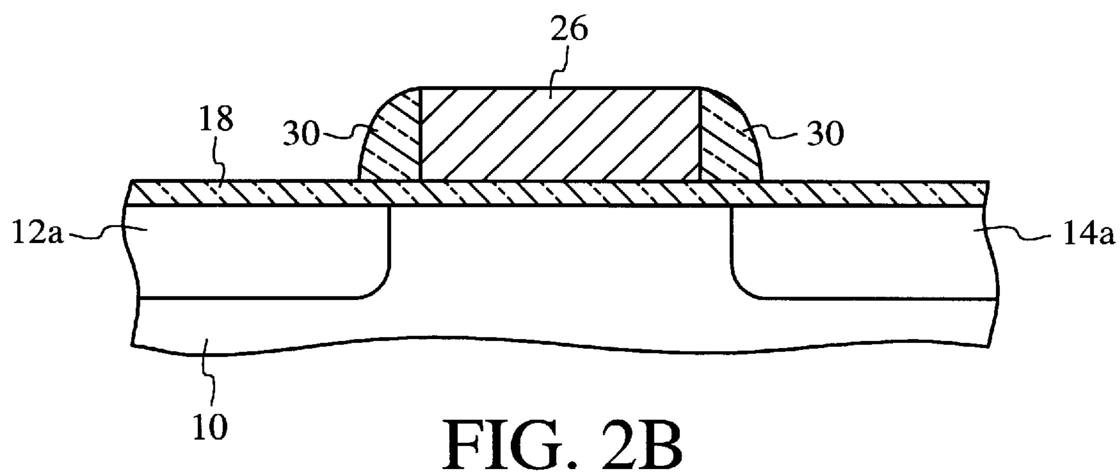

Following the formation of the main gate region 26, an $n^+$ mask (not shown) is provided to enable regions of the semiconductor substrate 10 to be heavily doped n-type, in particular, $n^{30}$. FIG. 2*b* shows a heavily doped source region ($n^+$ source region) 12*a* and a heavily doped drain region ($n^+$ drain region) 14*a* which are subsequently formed by ion implantation, in particular, by using an $n^+$ implant process.

In accordance with the present invention, disposable spacers 30 are added prior to the $n^+$ masking and the $n^+$ implant. The disposable spacers 30 are located on the gate oxide 18 adjacent the sidewalls 28 of the main gate region 26. The disposable spacers 30 are created by depositing and subsequently patterning a layer of patternable material (not shown). The patternable material may comprise, for example, silicon nitride. Other patternable materials may also be suitably employed in the process of the invention to create the disposable spacers 30. It will be appreciated, however, that the patternable material must serve as a barrier to the $n^+$ implant and, accordingly, protect portions of the semiconductor substrate 10 which lie beneath the disposable spacers 30 from the ion implantation. As described above, the disposable spacers 30 are formed prior to the $n^+$ implant. To form a disposable spacer, a thin film, e.g., $Si_3N_4$, is deposited and anisotropically etched back.

Once the disposable spacers 30 have been provided, the semiconductor substrate 10 is exposed to the $n^+$ implant. The polysilicon in the main gate region 26, as well as the portions of the semiconductor substrate 10 corresponding to the n source region 12*a* and the $n^+$ drain region 14*a*, are exposed to the ion implantation. As is conventional for doping silicon and polysilicon n-type, phosphorus or arsenic may be employed.

The $n^+$ implant is followed by a high temperature anneal which activates the implanted species, i.e., phosphorus or arsenic ions which are introduced into the semiconductor substrate 10 and the main gate region 26. The anneal is provided by a rapid thermal anneal (RTA) in a neutral ambient comprising, for example, nitrogen or argon gas. Prior to the anneal, the implanted species, i.e., the phosphorus or arsenic ions, are not electrically active. Without being activated by annealing, the ions introduced into the semiconductor substrate 10 and the main gate region 26 are not able to provide carriers (in this case, electrons) which can contribute to current flow in the MOS transistor.

After the anneal, the polysilicon in the main gate region 26 and the silicon in the doped regions of the semiconductor substrate 10 are sufficiently doped n-type. In particular, the silicon and the polysilicon exposed to the $n^+$ implant and rapid thermal anneal are doped $n^+$ . Accordingly, the heavily doped source region 12*a* and the heavily doped drain region 14*a* shown in FIG. 2*b* are formed.

Figure 2C:
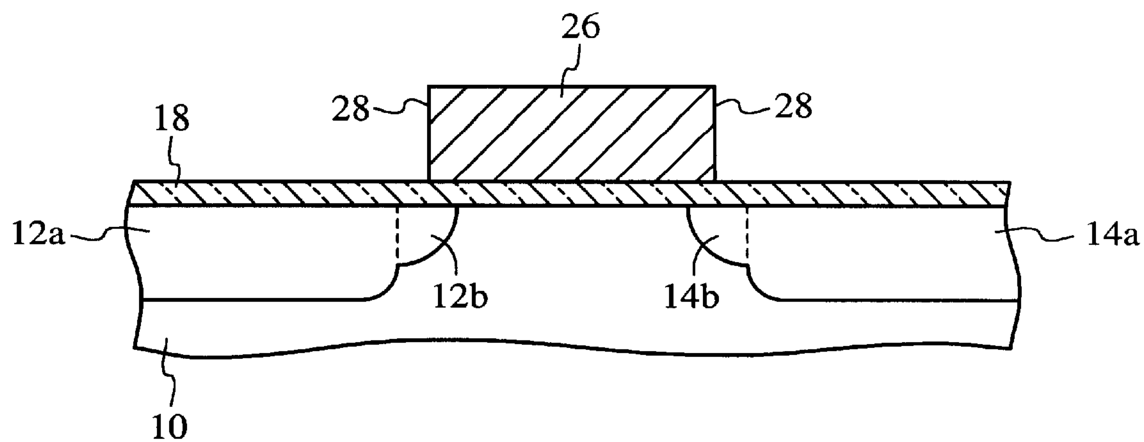

Following the $n^+$ implant, the disposable spacers 30 are removed and the semiconductor substrate 10 is exposed to an $n^+$ implant to provide lightly doped regions. As shown in FIG. 2*c*, the portion of the semiconductor substrate 10 below where the disposable spacers 30 were previously located is now uncovered. The polysilicon in the main gate region 26 as well as the portions of the semiconductor substrate 10 corresponding to the $n^+$ source region 12*a* and the $n^+$ drain region 14*a* are also exposed to the ion implantation. As is conventional for doping polysilicon and silicon n-type, phosphorus or arsenic may again be employed.

The $n^-$ implant is followed by a high temperature anneal which activates the implanted species, i.e., phosphorus or arsenic ions which are introduced into the semiconductor substrate 10 and the main gate region 26. As described above, the anneal is provided by a rapid thermal anneal (RTA) in a neutral ambient comprising, for example, nitrogen or argon gas.

After the anneal, the portions of the semiconductor substrate 10 below where the disposable spacers 30 were previously located are sufficiently doped n-type. A lightly doped source region ($n^-$ source region) 12*b* and a lightly doped drain region ($n^-$ drain region) 14*b*, as shown in FIG. 2*c*, are thereby formed.

In accordance with the present invention, depleted sidewall polysilicon spacers 32 comprising depleted polysilicon are provided adjacent the sidewalls 28 of the main gate region 26. The depleted sidewalls polysilicon spacers 32 are formed by depositing undoped polysilicon and etching back the polysilicon such that the lightly doped regions, i.e., the lightly doped source region 12*b* and the lightly doped drain region 14*b* are completely covered by the depleted sidewalls polysilicon spacers and the main gate region 26. An anisotropic etch may be employed to form the spacers 32.

Also, in accordance with the present invention, the depleted sidewalls polysilicon spacers 32 are not intentionally doped. The depleted sidewalls polysilicon spacers 32 comprise depleted polysilicon; i.e., polysilicon that is depleted of any dopant that may provide carriers that can contribute to current flow in the MOS transistor.

Figure 2D:
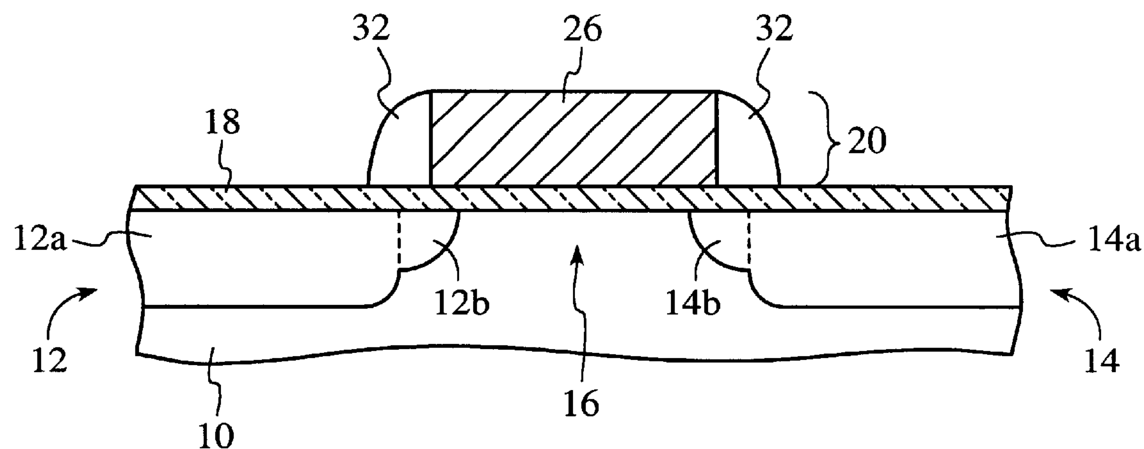

FIG. 2*d* depicts the MOS transistor of the present invention at this stage in the processing. As shown in FIG. 2*d*, the MOS transistor of the present invention includes a source region 12 and a drain region 14 separated by a channel region 16. The source region 12 comprises a heavily doped source region (or $n^-$ source region) 12*a* and a lightly doped source region (or $n^-$ source region) 12*b*. The lightly doped source region 12*b* resides adjacent the heavily doped source region 12*a* and extends to the channel region 16. similarly, the drain region 14 comprises a heavily doped drain region (or $n^-$ drain region) 14*a* and a lightly doped drain region (or $n^+$ drain region) 14*b*. The lightly doped drain region 14*b* resides adjacent the heavily doped drain region 14*a* and extends to the channel region 16. In the structure shown in FIG. 2*d*, the depleted sidewalls polysilicon spacers 32 overlap most of the lightly doped source region 12*b* and most of the lightly doped drain region 14*b*.

Figure 3:
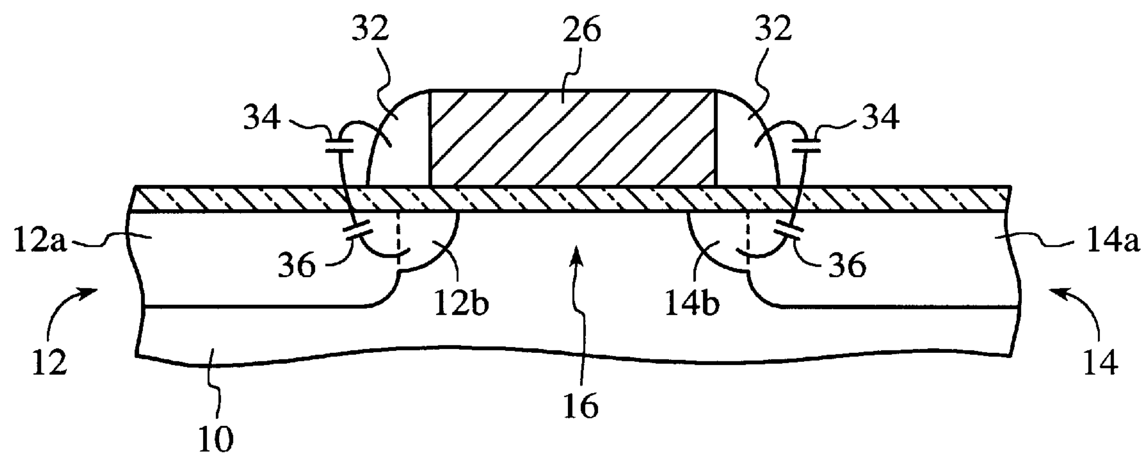
FIG. 3 is a cross-sectional view of the metal oxide semiconductor transistor of the present invention.

The gate oxide 18 covers the channel region 16 and portions of the source region 12 and drain region 14 which are shown in FIG. 3. A gate electrode 20 comprising gate polysilicon is formed on the gate oxide 18. The gate electrode 20 comprises a main gate region 26 having sidewalls 28 and depleted sidewall polysilicon spacers 32 formed adjacent the sidewalls. The main gate region 26 comprises doped polysilicon and the depleted sidewall polysilicon spacers 32 comprise undoped or depleted polysilicon. The depleted sidewall polysilicon spacers 32 overlap the lightly doped source region 12*b* and the lightly doped drain region 14*b*. FIG. 3 shows the depleted sidewall polysilicon spacers 32 overlapping most of the lightly doped source region 12*b* and the lightly doped drain region 14*b*.

It will be appreciated that electrical contacts (not shown) may be provided to the source region 12, the drain region 14, and the gate electrode 20 as is conventional in the art. Such electrical contact is typically provided to form electrical connection between different devices. Such connection may be formed, for example, using metal or polysilicon contacts and metal or polysilicon lines. Additionally, portions of the gate oxide 18 which is formed over the source region 12 and the drain region 14 may be required to be removed to access the source region and drain region. Insulation, such as field oxide, may also be required to separate source regions 12 and drain regions 14 in separate devices as is conventional.

It will further be appreciated that while one such metal oxide semiconductor transistor is shown, it will be readily apparent to those skilled in this art that in fact a plurality of such metal oxide semiconductor transistor may be formed with the method of the present invention.

The depleted sidewalls polysilicon spacers 32 which overlap the lightly doped regions, i.e., the lightly doped source region ($n^-$ source region) 12*b* and the lightly doped drain region ($n^-$ drain region) 14*b*, provide the advantages of conventional fully overlapped LDD transistors. In particular, performance degradation due to damage induced by hot carrier injection into the gate oxide 18 is improved because the lightly doped regions, or LDD regions, lie beneath the gate polysilicon. However, since the gate polysilicon which overlaps the lightly doped regions comprises depleted polysilicon, the overlap capacitance between the gate electrode 20 and the drain region 14, as well as the gate electrode and the source region 12, is reduced in comparison with conventionally employed fully overlapped LDD transistors wherein the gate polysilicon which overlaps the LDD regions does not comprise depleted polysilicon.

The capacitance between the gate electrode 20 and the drain region 14, as well as the capacitance between the gate electrode and the source region 12, for the MOS transistor of the present invention is given by a series combination of the capacitance produced across one of the depleted sidewalls polysilicon spacers 32 and the capacitance across the gate oxide 18. Consequently, this series combination is smaller than the capacitance across the gate oxide 18 alone.

Capacitors 34 and 36 which correspond to the capacitance produced across one of the depleted sidewalls polysilicon spacers 32, $C_{spacer}$, and the capacitance across the gate oxide 18, $C_{oxide}$, respectively, are schematically shown in FIG. 3. It will be appreciated that the value of the series combination of $C_{spacer}$ and $C_{oxide}$, applicable to the LDD structure of the present invention, is lower than the value of $C_{oxide}$, which corresponds to the drain-to-gate overlap capacitance applicable to prior art LDD structures. The addition of the capacitance across the depleted sidewall polysilicon spacer 32 in series with the capacitance across the gate oxide 18 effectively reduces the capacitance between the gate electrode 20 and the source region 12 as well as the capacitance between the gate electrode and the drain region 14. In particular, the present invention is expected to reduce the drain-to-gate overlap capacitance by appreciably more than a factor of two. By reducing the drain-to-gate overlap capacitance, the present invention enables higher device operating speeds to be achieved. Additionally, reliability and wear characteristics are improved by the present invention as damage to the gate oxide induced by hot carrier injection is minimized with the gate overlapped LDD structure.

Although the method of the present invention is applicable to any generation of IC technology, it will be appreciated that the present invention is applicable to IC technology having feature sizes of 0.25 $\mu$m and smaller.

INDUSTRIAL APPLICABILITY

The method of the present invention is expected to find use in the fabrication of deep sub-micrometer IC technology.

The foregoing description of the preferred embodiment of the present invention has been presented for purposes of illustration and description. It is not intended to be exhaustive or to limit the invention to the precise form disclosed. Obviously, many modifications and variations will be apparent to practitioners skilled in this art. Many variations of films and materials are possible. It is possible that the invention may be practiced in other fabrication technologies in MOS or bipolar processes. Similarly, any process steps described might be interchangeable with other steps in order to achieve the same result. The embodiment was chosen and described in order to best explain the principles of the invention and its practical application, thereby enabling others skilled in the art to understand the invention for various embodiments and with various modifications as are suited to the particular use contemplated. It is intended that the scope of the invention be defined by the claims appended hereto and their equivalents.

What is claimed is:

1. A method of forming a metal oxide semiconductor transistor formed in a semiconductor substrate having a first conductivity including a heavily doped source region, a lightly doped source region, a heavily doped drain region, and a lightly doped drain region, each having a second conductivity opposite said first conductivity, and a channel region in said semiconductor substrate having said first conductivity separating said heavily doped source region and said heavily doped drain region, said lightly doped source region located adjacent said heavily doped source region and extending to said channel region, said lightly doped drain region located adjacent said heavily doped drain region and extending to said channel region, said method comprising the steps of:

(a) forming a gate oxide on said semiconductor substrate;

(b) depositing and patterning a layer of polysilicon on said gate oxide thereby forming a main gate region over said channel region having two sidewalls;

(c) forming a mask on said semiconductor substrate which includes two disposable spacers each of which is adjacent one of said two sidewalls;

(d) exposing said main gate region and portions of said semiconductor substrate to a first ion implant and subsequent first anneal, thereby doping said main gate region and forming said heavily doped source region and said heavily doped drain region;

(e) removing said two disposable spacers;

(f) exposing said semiconductor substrate to a second ion implant and subsequent second anneal, thereby forming said lightly doped source region and said lightly doped drain region below where said two disposable spacers were previous located; and (g) providing a depleted sidewall polysilicon spacer comprising depleted polysilicon adjacent each of said two sidewalls by depositing and patterning undoped polysilicon such that said lightly doped source region and said lightly doped drain region are fully overlapped by the combination of said depleted sidewall polysilicon spacers and said main gate region, said undoped polysilicon covering a portion of said lightly doped source region and said lightly doped drain region.

2. The method of claim 1 wherein said semiconductor substrate comprises silicon.

3. The method of claim 1 wherein said first conductivity is p-type and said second conductivity is n-type.

4. The method of claim 3 wherein said first ion implant comprises an $n^+$ implant and said second ion implant comprises an $n^-$ implant.

5. The method of claim 4 wherein said first ion implant and said second ion implant involve implantation of ions selected from the group consisting of phosphorus and arsenic.

6. The method of claim 1 wherein said depleted sidewall polysilicon spacers are not doped.

7. The method of claim 1 wherein said gate oxide is formed by annealing said semiconductor substrate in an oxygen-containing atmosphere.

8. The method of claim 1 wherein said disposable spacers comprise patternable material.

9. The method of claim 8 wherein said disposable spacers comprise $Si_3N_4$.

10. The method of claim 1 wherein said first anneal and said second anneal involve a rapid thermal anneal in a neutral ambient.

11. The method of claim 10 wherein said neutral ambient comprises gas selected from the group consisting of nitrogen and argon.

12. The method of claim 1 wherein electrical contacts are formed with said heavily doped source region, said heavily doped drain region, and said main gate region.

* * * * *